(12) United States Patent
Azumo

(10) Patent No.: US 10,790,138 B2
(45) Date of Patent: Sep. 29, 2020

(54) METHOD AND SYSTEM FOR SELECTIVELY FORMING FILM

(71) Applicant: TOKYO ELECTRON LIMITED, Tokyo (JP)

(72) Inventor: Shuji Azumo, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/453,138

(22) Filed: Jun. 26, 2019

(65) Prior Publication Data
US 2020/0006057 A1 Jan. 2, 2020

(30) Foreign Application Priority Data

Jul. 2, 2018 (JP) .................................. 2018-125837

(51) Int. Cl.
*H01L 21/02* (2006.01)
*C23C 16/455* (2006.01)
*C23C 16/44* (2006.01)

(52) U.S. Cl.
CPC .... *H01L 21/02175* (2013.01); *C23C 16/4404* (2013.01); *C23C 16/45525* (2013.01)

(58) Field of Classification Search
CPC ........... H01L 21/02252; H01L 21/0228; C23C 16/45525; C23C 16/4404
See application file for complete search history.

(56) References Cited

U.S. PATENT DOCUMENTS

2012/0315740 A1* 12/2012 Yao .................... H01L 21/31155
438/468
2018/0233349 A1* 8/2018 Smith ............... H01L 21/02164
2019/0316256 A1* 10/2019 Bhuyan ................. C23C 16/405

FOREIGN PATENT DOCUMENTS

| JP | 2007-501902 A | 2/2007 |
| JP | 2007-533156 A | 11/2007 |
| JP | 2010-540773 A | 12/2010 |
| JP | 2013-520028 A | 5/2013 |

OTHER PUBLICATIONS

Hashemi, et al., "Selective Deposition of Dielectrics: Limits and Advantages of Alkanethiol Blocking Agents on Metal-Dielectric Patters", ACS Applied Materials & Interfaces 2016, 8(48), pp. 33264-33272, Nov. 17, 2016.

* cited by examiner

*Primary Examiner* — William Coleman
(74) *Attorney, Agent, or Firm* — Nath, Goldberg & Meyer; Jerald L. Meyer

(57) ABSTRACT

There is provided a method for forming a target film on a substrate comprising: preparing the substrate having a first substrate region and a second substrate region that has at least two types of surfaces formed of materials different from a material of the first substrate region; selectively forming, on the surfaces of the second substrate region, an intermediate film capable of adsorbing a first self-assembled monolayer that inhibits formation of the target film on the second substrate region; selectively adsorbing the first self-assembled monolayer on a surface of the intermediate film; and selectively forming the target film on a surface of the first substrate region.

18 Claims, 6 Drawing Sheets

METHOD AND SYSTEM FOR SELECTIVELY FORMING FILM

CROSS-REFERENCE TO RELATED APPLICATION

This application is based upon and claims the benefit of priority from Japanese Patent Application No. 2018-125837, filed on Jul. 2, 2018, the entire contents of which are incorporated herein by reference.

TECHNICAL FIELD

The present disclosure relates to a method and a system for selectively forming a film.

BACKGROUND

In the manufacture of semiconductor devices, a photolithography technique is widely used as a technique for selectively forming a film on a specific surface area of a substrate. For example, an insulating film is formed after forming a lower layer wiring, a dual damascene structure having a trench and a via hole is formed by photolithography and etching, and a conductive film made of, for example, Cu is embedded in the trench and the via hole to form a wiring.

However, in recent years, the miniaturization of semiconductor devices has been further advanced. Sometimes the positioning accuracy is not sufficient with the photolithography technique.

Therefore, there is a need for a method of selectively forming a film on the surface of a specific region of a substrate without using the photolithography technique. As such a technique, there has been proposed a technique of forming a self-assembled monolayer (SAM) on the surface of a substrate region where film formation is not desired, and forming a film only on the surface of a substrate region on which the SAM is not formed (see, e.g., Patent Documents 1 to 4 and Non-Patent Document 1).

PRIOR ART DOCUMENT

[Patent Document]
Patent Document 1: Japanese International Patent Application Publication No. 2007-501902
Patent Document 2: Japanese International Patent Application Publication No. 2007-533156
Patent Document 3: Japanese International Patent Application Publication No. 2010-540773
Patent Document 4: Japanese International Patent Application Publication No. 2013-520028
[Non-Patent Document]
Non-Patent Document 1: Hashemi, F. S. M. et. al ACS Appl. Mater. Interfaces 2016, 8 (48), pp 33264-33272, Nov. 7, 2016

SUMMARY

According to one embodiment of the present disclosure, there is provided a method for forming a target film on a substrate, the method comprising: preparing the substrate having a first substrate region and a second substrate region that has at least two types of surfaces formed of materials different from a material of the first substrate region; selectively forming, on the surfaces of the second substrate region, an intermediate film capable of adsorbing a first self-assembled monolayer that inhibits formation of the target film on the second substrate region; selectively adsorbing the first self-assembled monolayer on a surface of the intermediate film; and selectively forming the target film on a surface of the first substrate region.

BRIEF DESCRIPTION OF DRAWINGS

The accompanying drawings, which are incorporated in and constitute a part of the disclosure, illustrate embodiments of the present disclosure, and together with the general description given above and the detailed description of the embodiments given below, serve to explain the principles of the present disclosure.

DETAILED DESCRIPTION

Figure 1:
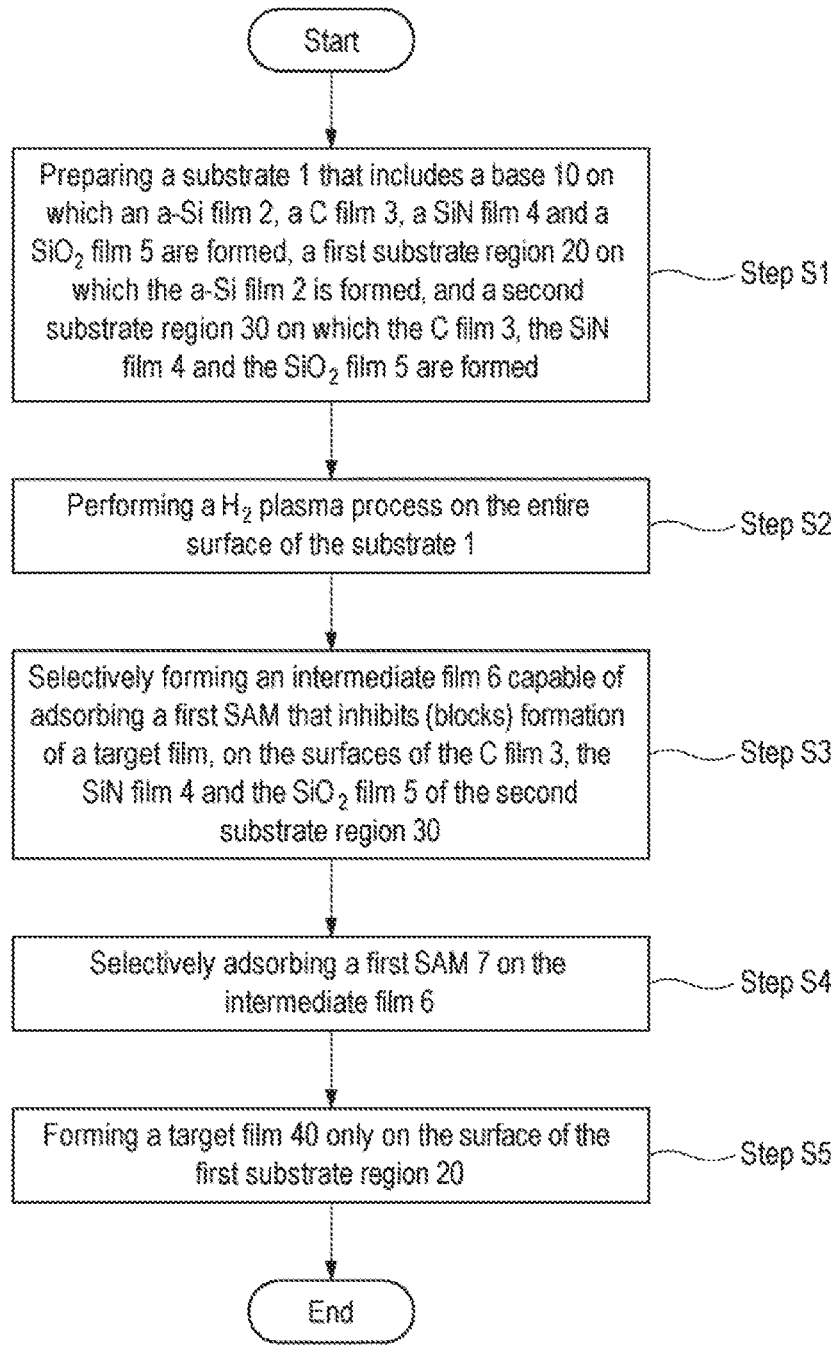
FIG. 1 is a flowchart illustrating a selective film-forming method according to a first embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments will be described with reference to the accompanying drawings.

Background and Overview

First, the background and overview of the method according to the present disclosure will be described.

Selective film formation using a SAM is conventionally performed on, for example, a substrate having a first substrate region whose surface is a metal and a second substrate region whose surface is a dielectric material. That is, for example, by causing a thiol-based SAM to be adsorbed to the first substrate region whose surface is metal, the formation of a dielectric film is inhibited, and the dielectric film is formed only in the second substrate region (see, for example. Non-Patent Document 1).

However, in such a method, if the substrate has three or more types of surfaces, it is difficult to selectively form a desired film on one of the surfaces.

Thus, according to one embodiment of the present disclosure, in a substrate which includes a first substrate region and a second substrate region that has at least two types of surfaces formed of materials different from a material of the first substrate region, when a target film is selectively formed only on the surface of the first substrate region, the following first to third steps are performed. The first step is a step of selectively forming, on the surface of the second substrate region, an intermediate film capable of adsorbing a first SAM that inhibits formation of a target film on the second substrate region. The second step is a step of selectively adsorbing the first SAM on the surface of the intermediate film after the first step. The third step is a step of selectively forming a target film on the surface of the first substrate region after the second step.

That is, according to one embodiment of the present disclosure, by forming an intermediate film on plural types of surfaces of the second substrate region, where a target film is not to be formed, among three or more types of different surfaces, the substrate is brought into a state in which the substrate has only two types of surfaces. In this state, by causing a first SAM, which inhibits formation of the target film, on the surface of the second substrate region covered with a protective film, it is possible to selectively form a predetermined film only on the surface of the first substrate region.

In this case, prior to the first step, it is possible to perform a step (fourth step) of performing a process capable of enabling an intermediate film to be formed only on the surface of the second substrate region on the substrate. Thus, the intermediate film can be easily formed only on the surface of the second substrate region. An example of the fourth step may be a process of performing a plasma processing on the surface of the substrate and modifying the surface of the first substrate region to a surface on which the intermediate film is not formed. Another example of the fourth step may be a process of adsorbing, on the first substrate region, a second SAM capable of being selectively adsorbed on the surface of the first substrate region and inhibiting formation of an intermediate film.

Specific Embodiments

Next, specific embodiments will be described.

First Embodiment

First, a first embodiment will be described.

Figure 2:
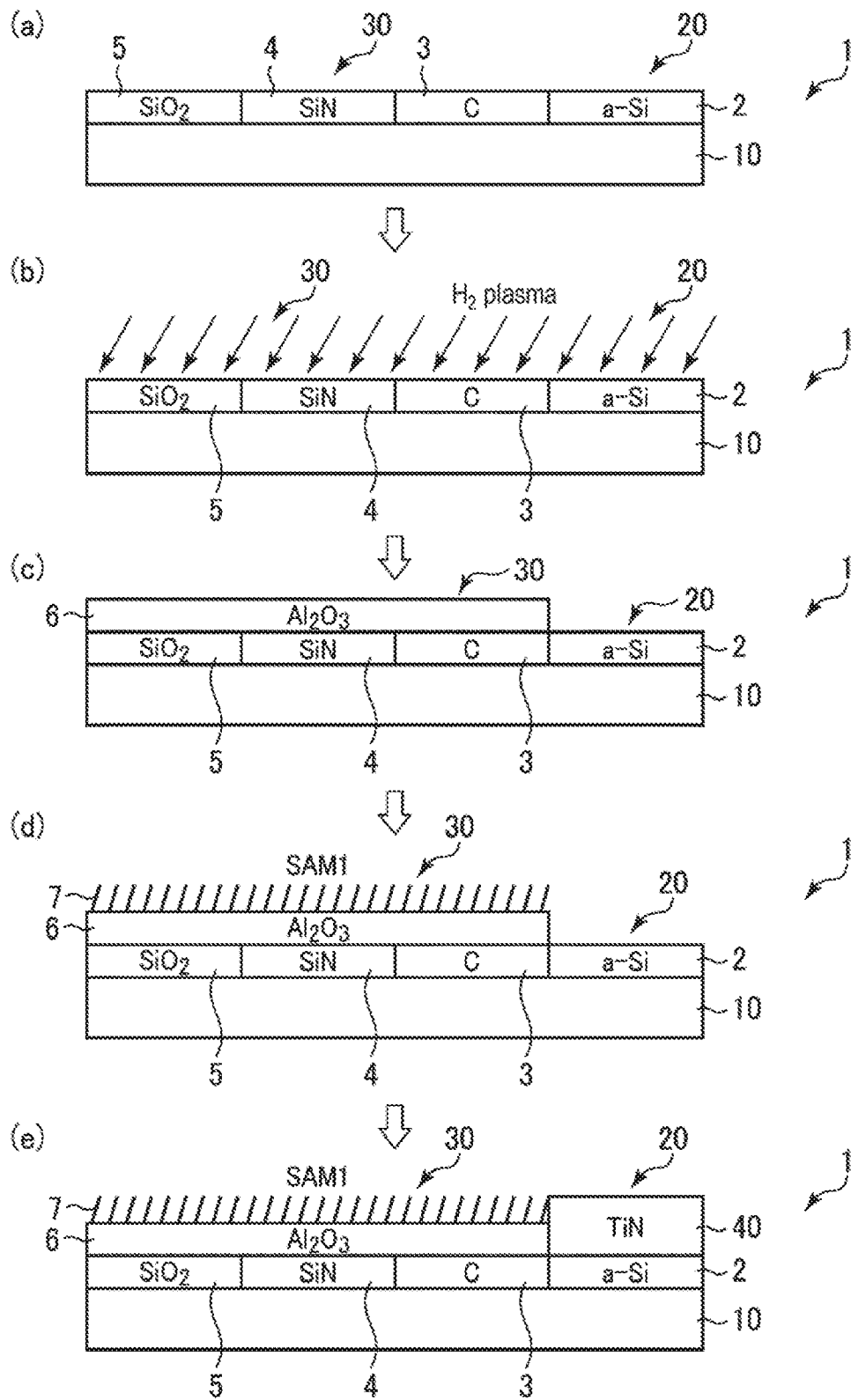
FIG. 2 illustrates process sectional views of the selective film-forming method according to the first embodiment.

FIG. 1 is a flowchart illustrating a selective film-forming method according to a first embodiment, and FIG. 2 illustrates process sectional views of the selective film-forming method according to the first embodiment.

In the present embodiment, there will be described an example where a target film is selectively formed only on the surface of an a-Si film in a substrate having plural types of surfaces (an amorphous silicon (a-Si) film, a carbon (C) film, a SiN film and a $SiO_2$ film).

First, a substrate 1 is prepared. The substrate 1 includes a base 10 on which an a-Si film 2, a C film 3, a SiN film 4 and a $SiO_2$ film 5 are formed, a first substrate region 20 on which the a-Si film 2 is formed, and a second substrate region 30 on which the C film 3, the SiN film 4 and the $SiO_2$ film 5 are formed (Step S1, (a) in FIG. 2). That is, the second substrate region 30 has at least two types of surfaces formed of materials different from a material of the first substrate region 20. The second substrate region 30 does not have to include all the C film 3, the SiN film 4 and the $SiO_2$ film 5 but may include at least two of the C film 3, the SiN film 4 and the $SiO_2$ film 5. In the present embodiment, a metal compound film such as a metal film or a metal nitride film, for example, a TiN film, is formed as a target film only on the surface of the first substrate region 20 (the surface of the a-Si film 2) of the aforementioned substrate 1. Typical examples of the substrate 1 include, but are not limited to, a semiconductor substrate (semiconductor wafer) in which these films are formed on a base 10 made of a semiconductor.

Next, a $H_2$ plasma process is performed on the entire surface of the substrate 1 (Step S2, (b) in FIG. 2). This process is a process of hydrogen-terminating the surface of the a-Si film 2. By this process, the surface of the a-Si film becomes Si—H, and the formation on the a-Si film 2 of an intermediate film to be formed next is inhibited. In other words, this process is a process that enables an intermediate film 6 to be formed only on the surface of the second substrate region 30.

Next, the intermediate film 6 capable of adsorbing a first SAM that inhibits (blocks) formation of a target film, for example, a TiN film, is selectively formed on the surfaces of the C film 3, the SiN film 4 and the $SiO_2$ film 5 of the second substrate region 30 (Step S3, (c) in FIG. 2).

As the intermediate film 6, a dielectric film such as an $Al_2O_3$ film or the like is used. The $Al_2O_3$ film may be formed, for example, by ALD using a trimethylaluminum (TMA) gas as an aluminum precursor and using a $H_2O$ gas as an oxidizing agent. In this operation, the surface of the a-Si film 2 is hydrogen-terminated to become Si—H, and the surface of the second substrate region 30 (the surfaces of the C film 3, the SiN film 4 and the $SiO_2$ film 5) has OH. Therefore, the intermediate film 6 is selectively formed only on the surface of the second substrate region 30 having OH. The thickness of the intermediate film 6 is about 1 nm, which is sufficient.

Next, a first SAM 7 is selectively adsorbed on the intermediate film 6 (Step S4, (d) in FIG. 2). The first SAM 7 may be formed by supplying an organic compound gas. The first SAM 7 has a property that it is adsorbed only on the surface of the intermediate film 6 having OH on the surface thereof and not adsorbed on the surface of the hydrogen-terminated a-Si film 2, and also has a property that, as described above, it inhibits formation of a target film, for example, a TiN film.

Examples of the organic compound for forming the first SAM 7 include a silane-based compound. As the silane-based compound, it may be possible to use a compound represented by a general formula R—$SiCl_x$ (x=1, 2 or 3) or a compound (silane coupling agent) represented by R'—Si(O—R)$_3$. In this regard, R or R' is a functional group such as an alkyl group or the like, and O—R is a hydrolysable functional group, for example, a methoxy group or an ethoxy group. Examples of the silane coupling agent include octamethyltrimethoxysilane (OTS).

Next, a target film 40, for example, a TiN film, is formed only on the surface of the first substrate region 20 (Step S5, (e) in FIG. 2). That is, since the first SAM 7 has a function of inhibiting formation of the target film 40, as a result, the target film 40, for example, the TiN film, is selectively formed only on the surface of the first substrate region 20 (the surface of the a-Si film 2). The TiN film may be formed, for example, by ALD using an organic compound source gas such as TDMAT or the like or a $TiCl_4$ gas as a source gas and using an $NH_3$ gas as a reaction gas.

If, in forming the target film 40 in Step S5, the first SAM 7 does not have a blocking function to a target film thickness, Steps S4 and S5 are repeated.

Thus, the object of forming the target film 40 at a desired film thickness only on the surface of the a-Si film 2 in the first substrate region 20 is achieved. The film on which the target film 40 is selectively to be formed is not limited to the a-Si film, and may be a metal film such as, for example, a Cu film, a W film, a Co film or a Ru film.

Thereafter, the first SAM 7 and the intermediate film 6 are removed by etching. The surfaces of the C film 3, the SiN film 4 and the $SiO_2$ film 5 are appropriately processed depending on the device to be obtained.

In an exemplary selective film-forming method using a SAM, the problems as follows may occur if three or more different types of surfaces are present on a substrate, and a target film needs to be selectively formed on only one of the surfaces. That is, if there are two or more types of surfaces on which a target film is not desired to be formed, and a SAM is adsorbed on these surfaces to inhibit (block) film formation, the degrees of the inhibition of the film formation may vary and the selective film formation may not be sufficient in some cases. In particular, if there is no compound suitable as a SAM that inhibits film formation on a surface of a carbon film and if a carbon film is included in the surface on which a target film is not to be formed, it may be difficult to perform a film formation inhibition process (blocking process) using a SAM.

On the other hand, in the present embodiment, the intermediate film 6 capable of adsorbing the first SAM 7 that inhibits (blocks) formation of the target film is formed on the second substrate region 30 that has two or more types of different surfaces on which the target film is not to be formed. As a result, the substrate surface includes two types of surfaces, namely the intermediate film 6 on which the first SAM 7 is adsorbed and the surface of the first substrate region (i.e., the surface of the a-Si film 2) on which the first SAM 7 is not adsorbed. Therefore, the first SAM 7 for selectively blocking formation of the target film 40 can be adsorbed on the intermediate film 6, and the target film 40 can be formed only on the first substrate region 20.

Furthermore, in the first embodiment, by carrying out Step S2 of performing a $H_2$ plasma process on the substrate surface prior to the formation of the intermediate film 6 in Step S3, the surface of the a-Si film 2 of the first substrate region 20 is hydrogen-terminated to block the formation of the intermediate film 6 in the surface of the a-Si film 2 of the first substrate region 20. Thus, it is possible to easily form the surface on which the intermediate film 6 can be selectively formed.

Second Embodiment

Next, a second embodiment will be described.

Figure 3:
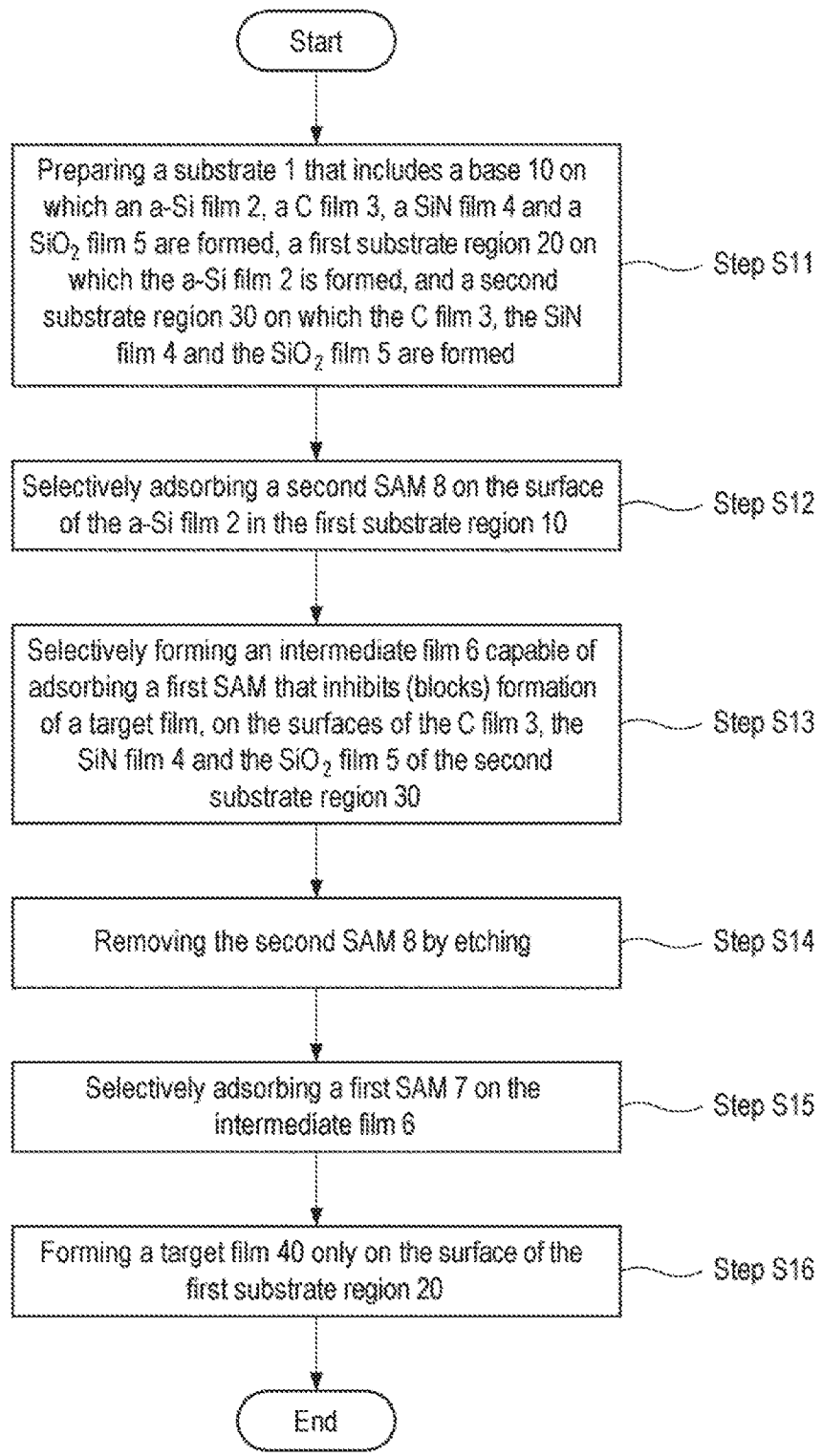
FIG. 3 is a flowchart illustrating a selective film-forming method according to a second embodiment.
Figure 4:
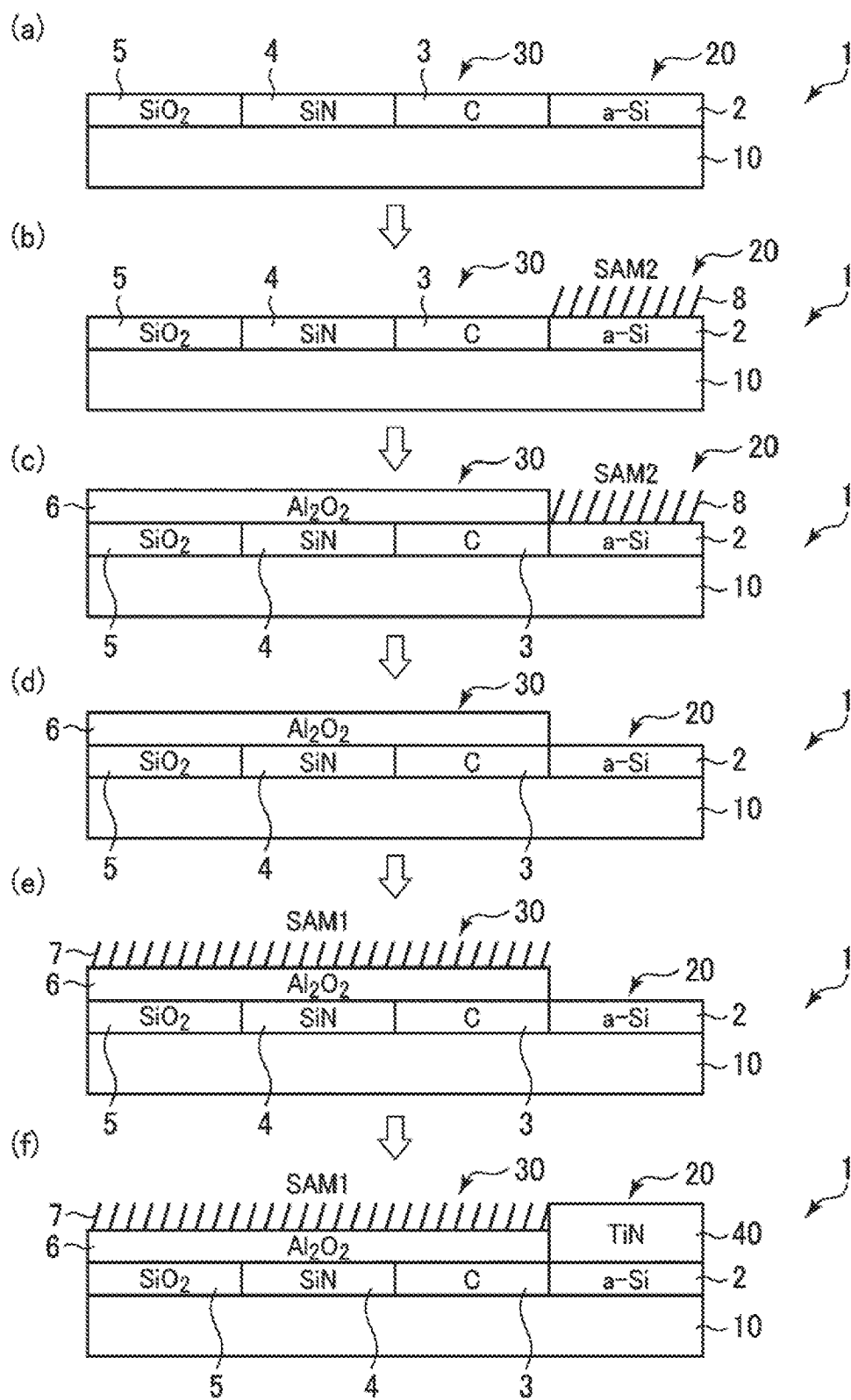
FIG. 4 illustrates process sectional views of the selective film-forming method according to the second embodiment.

FIG. 3 is a flowchart illustrating a selective film-forming method according to a second embodiment, and FIG. 4 illustrates process sectional views of the selective film-forming method according to the second embodiment.

In the present embodiment, as in the first embodiment, an example will be described where a target film is selectively formed only on the surface of an a-Si film in a substrate having plural types of surfaces (an amorphous silicon (a-Si) film, a carbon (C) film, a SiN film and a $SiO_2$ film).

First, a substrate 1 is prepared, and the substrate 1 includes a base 10 on which an a-Si film 2, a C film 3, a SiN film 4 and a $SiO_2$ film 5 are formed, a first substrate region 20 on which the a-Si film 2 is formed, and a second substrate region 30 on which the C film 3, the SiN film 4 and the $SiO_2$ film 5 are formed (Step S11, (a) in FIG. 4). As in Step S1 of the first embodiment, the second substrate region 30 has at least two types of surfaces formed of materials different from a material of the first substrate region 20. In the present embodiment, the second substrate region 30 does not have to include all the C film 3, the SiN film 4 and the $SiO_2$ film 5 but may include at least two of the C film 3, the SiN film 4 and the $SiO_2$ film 5. Furthermore, a metal compound film such as a metal film or a metal nitride film, for example, a TiN film, is formed as a target film only on the surface of the a-Si film 2 of the first substrate region 20 of the aforementioned substrate 1. Typical examples of the substrate 1 include, but are not limited to, a semiconductor substrate (semiconductor wafer) in which these films are formed on a base 10 made of a semiconductor.

Next, a second SAM 8 is selectively adsorbed on the surface of the a-Si film 2 in the first substrate region 10 (Step S12, (b) in FIG. 4). The second SAM 8 is capable of being selectively adsorbed on the surface of the first substrate region (the surface of the a-Si film 2) and has a function of inhibiting formation of an intermediate film 6. As the second SAM 8, it may be possible to use, for example, a thiol-based compound represented by a general formula R—SH. In this regard, R is a substituted or non-substituted aliphatic hydrocarbon group or aromatic hydrocarbon group which may contain a halogen atom or a heteroatom. The thiol-based compound has a property of being adsorbed on the surface of a Si film or a metal film and not being adsorbed on the surface of oxide or carbon, and has a property of preventing a dielectric film such as an $Al_2O_3$ film or the like from being adsorbed on the surface of the thiol-based compound.

Next, as in Step S2 of the first embodiment, an intermediate film 6 to which a first SAM can be adsorbed is selectively formed on the surfaces of the C film 3, the SiN film 4 and the $SiO_2$ film 5 in the second substrate region 30 (Step S13, (c) in FIG. 4). A dielectric film such as an $Al_2O_3$ film or the like used as the intermediate film 6 is blocked by the second SAM 8 and is selectively formed only on the surface of the second substrate region 30.

Next, the second SAM 8 is removed by etching (Step S14, (d) in FIG. 4).

Next, as in Step S4 of the first embodiment, a first SAM 7 is selectively adsorbed on the intermediate film 6 (Step S15, (e) in FIG. 4).

Next, as in Step S5 of the first embodiment, a target film 40, for example, a TiN film, is formed only on the surface of the first substrate region 20 (Step S16, (f) in FIG. 4).

Thus, the object of forming the target film 40 at a desired film thickness only on the surface of the a-Si film 2 in the first substrate region 20 is achieved. The film on which the target film 40 is selectively to be formed is not limited to the a-Si film, and may be a metal film such as, for example, a Cu film, a W film, a Co film or a Ru film.

Thereafter, the first SAM 7 and the intermediate film 6 are removed by etching. The surfaces of the C film 3, the SiN film 4 and the $SiO_2$ film 5 are appropriately processed depending on the device to be obtained.

Even in the second embodiment, the intermediate film 6 capable of adsorbing the first SAM 7 that inhibits (blocks) formation of the target film is formed on the second substrate region 30 that has two or more types of different surfaces on which the target film is not to be formed. As a result, the substrate surface includes two types of surfaces, namely the intermediate film 6 on which the first SAM 7 is adsorbed and the surface of the first substrate region (i.e., the surface of the a-Si film 2) on which the first SAM 7 is not adsorbed. Therefore, the first SAM 7 for selectively blocking formation of the target film 40 can be adsorbed on the intermediate film 6, and the target film 40 can be formed only on the first substrate region 20.

Furthermore, in the second embodiment, prior to the formation of the intermediate film 6 in Step S13, Step S12 of absorbing the second SAM 8 which can be selectively adsorbed on the a-Si film and which inhibits formation of the intermediate film 6 made of a dielectric film such as an $Al_2O_3$ film or the like is carried out. Thus, it is possible to block the adsorption of the intermediate film 6 on the surface of the first substrate region 20 (the surface of the a-Si film 2), such that the intermediate film 6 can be easily and selectively formed only in the second substrate region 30.

<Film-Forming System>

Next, a system for implementing the selective film-forming method according to an embodiment of the present disclosure will be described.

The method of selectively forming a film according to an embodiment of the present disclosure may be implemented by any one of a batch apparatus, a single-wafer apparatus and a semi-batch apparatus. However, the optimum temperature may be different for each of the steps described above, and the implementation of the each step may be disturbed if the surface of the substrate is oxidized to change the surface state. In consideration of such points, a multi-chamber type single-wafer film-forming system may be used. The multi-chamber type single-wafer film-forming system is capable of easily setting the each step to an optimum temperature and capable of performing all the steps in vacuum.

Hereinafter, the multi-chamber type single-wafer film-forming system will be described.

Figure 5:
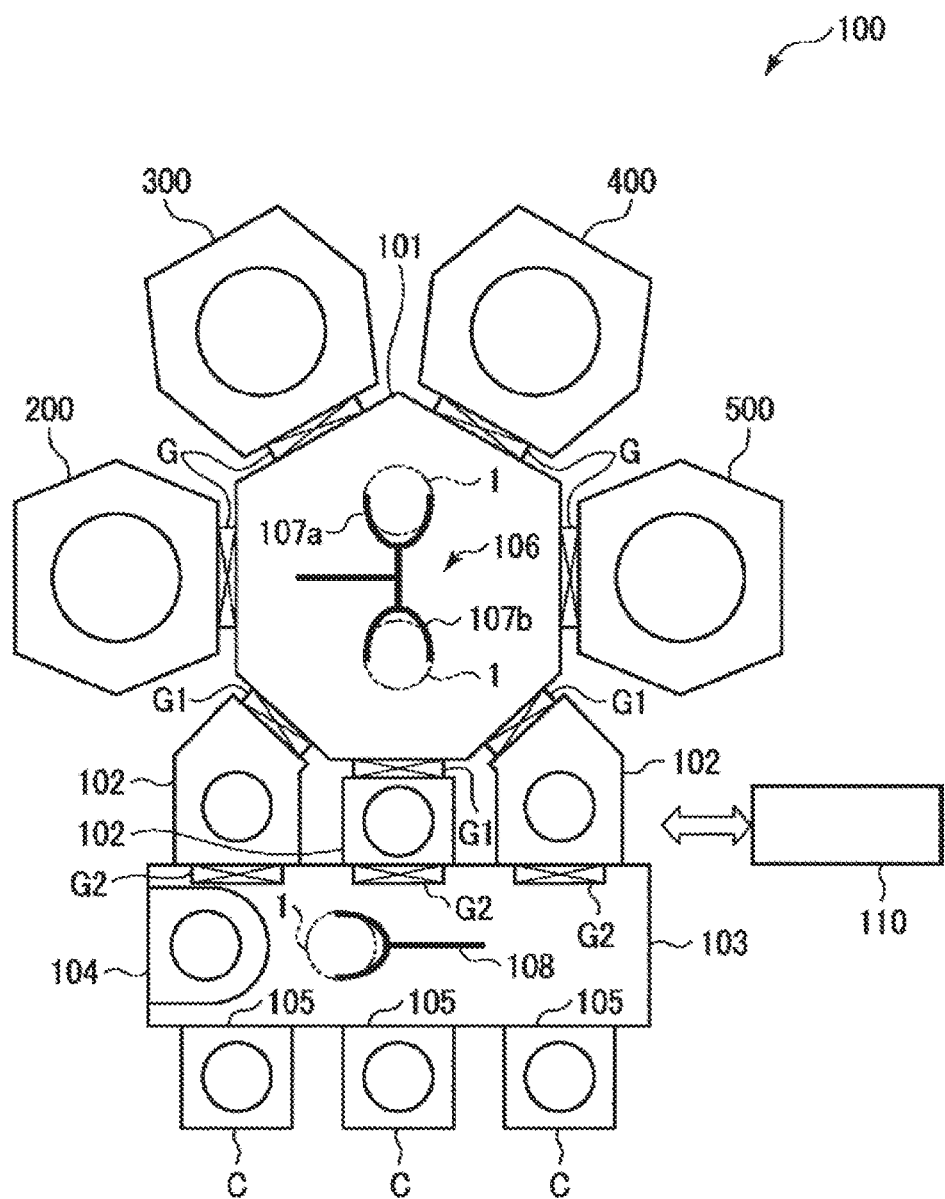
FIG. 5 is a schematic view illustrating an example of a film-forming system for implementing a selective film-forming method according to an embodiment.

FIG. 5 is a schematic view illustrating an example of a film-forming system for implementing the selective film-forming method according to an embodiment of the present disclosure.

As illustrated in FIG. 5, the film-forming system 100 includes an intermediate film forming device 200, a SAM-forming device 300, a target film forming device 400, and a plasma processing device 500. These devices are connected to four walls of a vacuum transfer chamber 101 having a heptagonal shape in a plan view via gate valves G, respectively. The inside of the vacuum transfer chamber 101 is evacuated by a vacuum pump and kept at a predetermined degree of vacuum. That is, the film-forming system 100 is a multi-chamber type vacuum processing system and capable of continuously performing the above-described selective film-forming method without breaking the vacuum.

The intermediate film forming device 200 is configured to form the intermediate film 6, for example, an $Al_2O_3$ film, on the second substrate region 30 of the substrate 1 by ALD.

The SAM-forming device 300 is configured to selectively form the first SAM 7 or the second SAM 8 by supplying an organic compound gas for forming a SAM to a film of the substrate 1.

The target film forming device 400 is configured to form the target film 40, for example, a TiN film, on a film of the first substrate region 20 of the substrate 1, for example, the a-Si film 2, by ALD.

The plasma processing device 500 is configured to perform a process of hydrogen-terminating the surface of the a-Si film 2 by $H_2$ plasma or a process of etching away the first SAM 7 or the second SAM 8.

Three load lock chambers 102 are connected to the remaining three walls of the vacuum transfer chamber 101 via gate valves G1. An atmosphere transfer chamber 103 is provided on the opposite side of the vacuum transfer chamber 101 across the load lock chambers 102. The three load lock chambers 102 are connected to the atmosphere transfer chamber 103 via gate valves G2. The load lock chambers 102 are configured to perform pressure control between atmospheric pressure and vacuum when the substrate 1 is transferred between the atmosphere transfer chamber 103 and the vacuum transfer chamber 101.

On the wall of the atmosphere transfer chamber 103 opposite to the load lock chambers 102, there are provided three carrier mounting ports 105 for mounting carriers (FOUPs, etc.) C that accommodate substrates 1. Furthermore, on the side wall of the atmosphere transfer chamber 103, there is provided an alignment chamber 104 for aligning the substrate 1. In the atmosphere transfer chamber 103, a down flow of a clean air is formed.

In the vacuum transfer chamber 101, there is provided a first transfer device 106. The first transfer device 106 transfers the substrate 1 to the intermediate film forming device 200, the SAM-forming device 300, the target film forming device 400, the plasma processing device 500, and the load lock chambers 102. The first transfer device 106 includes two independently-movable transfer arms 107*a* and 107*b*.

In the atmosphere transfer chamber 103, there is provided a second transfer device 108. The second transfer device 108 transfers the substrate 1 to the carriers C, the load lock chambers 102 and the alignment chamber 104.

The film-forming system 100 includes an overall controller 110. The overall controller 110 includes a main controller having a CPU (computer), an input device (a keyboard, a mouse, etc.), an output device (a printer, etc.), a display device (a display, etc.), and a memory device (storage medium). The main controller controls the respective components of the intermediate film forming device 200, the SAM-forming device 300, the target film forming device 400, the plasma processing device 500, the vacuum transfer chamber 101, and the load lock chambers 102. The main controller of the overall controller 110 causes the film-forming system 100 to perform an operation for implementing the methods of the first embodiment and the second embodiment based on a process recipe stored in, for example, the storage medium built in the memory device or the storage medium set in the memory device. A lower-level controller may be provided in each device, and the overall controller 110 may be configured as a higher-level controller.

In the film-forming system configured as described above, the substrate 1 is taken out from the carrier C connected to the atmosphere transfer chamber 103 by the second transfer device 108 and is loaded into one of the load lock chambers 102 after passing through the alignment chamber 104. Then, after evacuating the inside of the load lock chamber 102, the substrate 1 is transferred to the intermediate film forming device 200, the SAM-forming device 300, the target film forming device 400 and the plasma processing device 500 by the first transfer device 106 and is subjected to the processing of the first or second embodiment. Thereafter, if necessary, the first SAM 7 and the intermediate film 6 are etched away by the plasma processing device 500.

After the above processing is completed, the substrate 1 is transferred to any one of the load lock chambers 102 by the first transfer device 106, and the substrate 1 in the load lock chamber 102 is returned to the carrier C by the second transfer device 108.

The above-described processing is performed simultaneously on a plurality of substrates 1 in parallel to complete a selective film-forming process for a predetermined number of the substrates 1.

Since each of these processes is performed by an independent single-wafer apparatus, it is easy to set a temperature most suitable for each process. Since a series of processes can be performed without breaking the vacuum, it is possible to suppress oxidation in the process.

<Example of Film-Forming Process and SAM-Forming Device>

Next, an example of a film-forming device such as the intermediate film forming device 200 or the target film forming device 400, and an example of the SAM-forming device 300 will be described.

Figure 6:
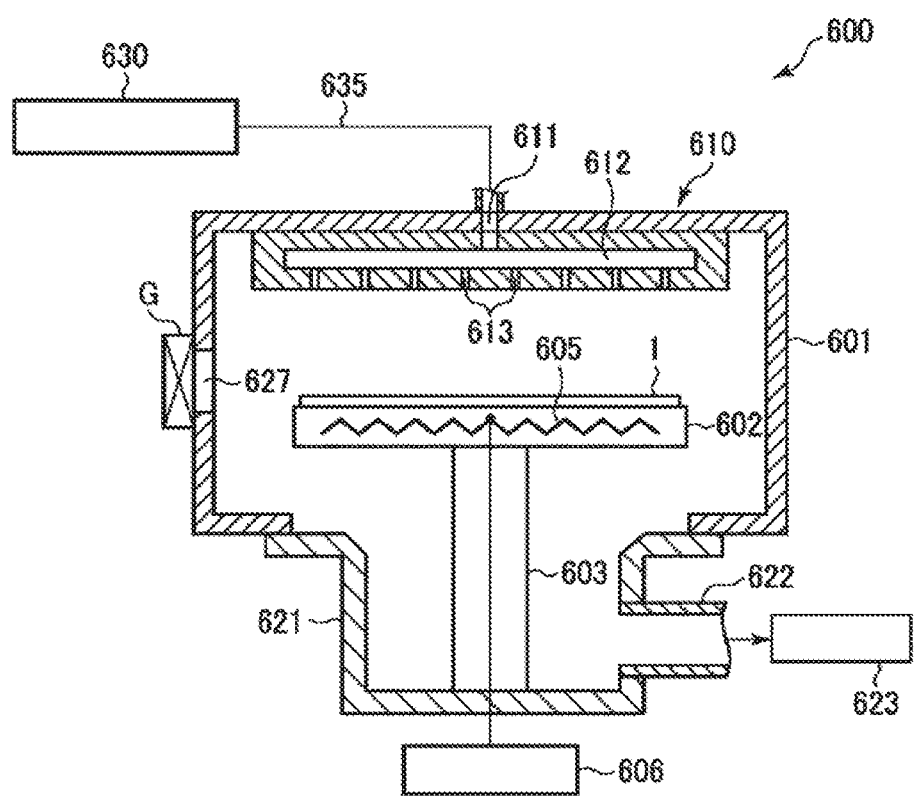
FIG. 6 is a sectional view illustrating an example of a processing device that can be used as a film-forming device and a SAM-forming device of the system illustrated in FIG. 5.

FIG. 6 is a sectional view illustrating an example of a processing device that can be used as the film-forming device and the SAM-forming device.

The film-forming device such as the intermediate film forming device 200 or the target film forming device 400, and the SAM-forming device 300 may be devices having the same configuration and may be configured as, for example, a processing device 600 illustrated in FIG. 6.

The processing device 600 includes a substantially cylindrical processing container 601 having an airtight configuration. In the processing device 600, a susceptor 602 for horizontally supporting the substrate 1 is supported and arranged by a cylindrical-shaped support 603 provided at the center of the bottom wall of the processing container 601. A heater 605 is embedded in the susceptor 602. The heater 605 heats the substrate 1 to a predetermined temperature by being supplied with electric power from a heater power supply 606. In the susceptor 602, a plurality of wafer lift pins (not shown) for supporting and elevating the substrate 1 is provided so as to be able to protrude and retract with respect to the surface of the susceptor 602.

A shower head 610 for introducing a processing gas for film formation or SAM formation into the processing container 601 in a shower shape is provided in the top wall of the processing container 601 facing the susceptor 602. The shower head 610 is configured to discharge a gas supplied from a gas supply 630, which will be described later, into the processing container 601. A gas inlet port 611 for introducing the gas is formed on the upper portion of the shower head 610. Furthermore, a gas diffusion space 612 is formed inside the shower head 610. A large number of gas discharge holes 613 communicating with the gas diffusion space 612 are formed on the bottom surface of the shower head 610.

The bottom wall of the processing container 601 is provided with an exhaust chamber 621 protruding downward. An exhaust pipe 622 is connected to a side surface of the exhaust chamber 621. An exhaust device 623 including a vacuum pump, a pressure control valve and the like is connected to the exhaust pipe 622. By operating the exhaust device 623, the inside of the processing container 601 can be brought into a predetermined reduced pressure (vacuum) state.

A loading/unloading port 627 for loading and unloading the substrate 1 with respect to the vacuum transfer chamber 101 is provided on the side wall of the processing container 601. The loading/unloading port 627 is opened and closed by a gate valve G.

The gas supply 630 includes gas supply sources supplying gases necessary for formation of the intermediate film, the target or SAM, individual pipes for supplying the gases from the respective gas supply sources, opening/closing valves provided in the individual pipes, and flow rate controllers such as mass flow controllers or the like for controlling the flow rates of the gases. The gas supply 630 further includes a gas supply pipe 635 for guiding the gases from the individual pipes to the shower head 610 via the gas inlet port 611.

When the processing device 600 performs formation of an $Al_2O_3$ film as the intermediate film 6 by ALD, the gas supply 630 supplies, for example, a TMA gas as a source gas and an $H_2O$ gas as a reaction gas to the shower head 610. Furthermore, when the processing device 600 performs formation of a TiN film as the target film 40 by ALD, the gas supply 630 supplies, for example, an organic compound source gas such as a TDMAT or the like or a $TiCl_4$ gas as a source gas and an $NH_3$ gas as a reaction gas to the shower head 610. Furthermore, when the processing device 600 performs formation of a SAM, the gas supply 630 supplies a vapor of a compound for forming the SAM into the processing container 601. In addition, the gas supply 630 is also configured to be able to supply an inert gas such as an $N_2$ gas or an Ar gas as a purge gas or a heat transfer gas.

In the processing device 600 configured as described above, the gate valve G is opened, the substrate 1 is loaded into the processing container 601 from the loading/unloading port 627, and placed on the susceptor 602. The susceptor 602 is heated to a predetermined temperature by the heater 605, and the substrate 1 is heated by introducing an inert gas into the processing container 601. Then, the inside of the processing container 601 is exhausted by the vacuum pump of the exhaust device 623 to adjust the pressure in the processing container 601 to a predetermined pressure.

Next, when the processing device 600 performs formation of an $Al_2O_3$ film as the intermediate film 6 by ALD, for example, a TMA gas as a source gas and an $H_2O$ gas as a reaction gas are alternately supplied from the gas supply 630 into the processing container 601 with the purge of the inside of the processing container 601 interposed therebetween. Furthermore, when the processing device 600 performs formation of a TiN film as the target film 40 by ALD, for example, an organic compound source gas such as a TDMAT or the like or a $TiCl_4$ gas as a source gas and an $NH_3$ gas as a reaction gas are alternately supplied from the gas supply 630 into the processing container 601 with the purge of the inside of the processing container 601 interposed therebetween. In addition, when the processing device 600 performs formation of a SAM, an organic compound vapor for forming the SAM is supplied from the gas supply 630 into the processing container 601.

<Other Application>

Although the embodiments have been described above, it should be noted that the embodiments disclosed above are illustrative and not restrictive in all respects. The embodiments described above may be omitted, substituted or changed in various forms without departing from the scope of the appended claims and the subject matter of the claims.

For example, in the above-described embodiments, the $SiO_2$ film, the SiN film and the C film are used as the plurality of films forming the surface of the second substrate region where the target film is not to be formed, and the a-Si film (or the metal film) is used as the film forming the surface of the first substrate region. However, the present disclosure is not limited thereto. Furthermore, in the above-described embodiments, the TiN film is illustrated as the target film. However, the present disclosure is not limited thereto. Furthermore, the material of the intermediate film is not limited to the dielectric film and is appropriately selected depending on the materials of the first substrate region and the target film. For example, the first substrate region may be an oxide-based film, and the target film may be an oxide-based film, in which case a Si film or a metal-based film may be used as the plurality of films forming the surface of the second substrate region and a Si film or a metal-based film may be used as the intermediate film. In addition, the compound for the SAM is not limited to the compounds of the above-described embodiments. A compound which is adsorbed on the intermediate film and not adsorbed on the target film may be selected depending on the selected intermediate film and target film.

Furthermore, in the above-described embodiments, for the sake of convenience, there is illustrated the case where the surface of the first substrate region and the surface of the second substrate region are planar. However, the present disclosure is not limited thereto. The surface of the first substrate region and the surface of the second substrate region may have any shape such as a recess or the like.

Moreover, in the above-described embodiments, there is illustrated the case where a semiconductor substrate (semiconductor wafer) was used as the substrate. However, the present disclosure is not limited thereto. Other substrates such as a glass substrate and a ceramic substrate may be used.

According to the present disclosure in some embodiments, it is possible to selectively form a film on only one specific surface of a substrate having three or more types of surfaces.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method for forming a target film on a substrate, the method comprising:
    preparing the substrate having a first substrate region and a second substrate region that has at least two types of surfaces formed of materials different from a material of the first substrate region;
    selectively forming, on the surfaces of the second substrate region, an intermediate film capable of adsorbing a first self-assembled monolayer that inhibits formation of the target film on the second substrate region;
    selectively adsorbing the first self-assembled monolayer on a surface of the intermediate film; and
    selectively forming the target film on a surface of the first substrate region.

2. The method of claim 1, wherein the first substrate region includes an a-Si film or a metal film.

3. The method of claim 1, wherein at least two types of materials selected from the group consisting of a $SiO_2$ film, a SiN film and a carbon film form the at least two types of the surfaces of the second substrate region.

4. The method of claim 1, wherein the intermediate film is a dielectric film.

5. The method of claim 1, further comprising, prior to the selectively forming the intermediate film, performing a process of enabling the intermediate film to be formed only on the surfaces of the second substrate region.

6. A system for forming a target film on a substrate, the system comprising:
    a transfer chamber having a transfer device for transferring the substrate;
    an intermediate film forming device connected to the transfer chamber;
    a target film forming device connected to the transfer chamber;
    a self-assembled monolayer adsorbing device connected to the transfer chamber; and
    a controller configured to control the transfer device, the intermediate film forming device, the target film forming device and the self-assembled monolayer adsorbing device, the controller being configured to control the transfer device, the intermediate film forming device, the target film forming device and the self-assembled monolayer adsorbing device to implement the method of claim 1.

7. The method of claim 2, wherein the target film is a metal film or a metal compound film.

8. The method of claim 7, wherein the target film is a TiN film.

9. The method of claim 8, wherein at least two types of materials selected from the group consisting of a $SiO_2$ film, a SiN film and a carbon film form the at least two types of the surfaces of the second substrate region.

10. The method of claim 9, wherein the intermediate film is a dielectric film.

11. The method of claim 10, wherein the intermediate film is an $Al_2O_3$ film.

12. The method of claim 11, further comprising, prior to the selectively forming the intermediate film, performing a process of enabling the intermediate film to be formed only on the surfaces of the second substrate region.

13. The method of claim 12, wherein in the process of enabling the intermediate film to be formed only on the surfaces of the second substrate region, a second self-assembled monolayer, which is capable of being selectively adsorbed on the surface of the first substrate region and inhibiting formation of the intermediate film, is adsorbed on the first substrate region.

14. The method of claim 12, wherein in the process of enabling the intermediate film to be formed only on the surfaces of the second substrate region, a surface of the substrate is subjected to plasma processing and the surface of the first substrate region is modified to a surface on which the intermediate film is not formed.

15. The method of claim 4, wherein the intermediate film is an $Al_2O_3$ film.

16. The method of claim 15, wherein in the process of enabling the intermediate film to be formed only on the surfaces of the second substrate region, a second self-assembled monolayer, which is capable of being selectively adsorbed on the surface of the first substrate region and inhibiting formation of the intermediate film, is adsorbed on the first substrate region.

17. The method of claim 5, wherein in the process of enabling the intermediate film to be formed only on the surfaces of the second substrate region, a surface of the substrate is subjected to plasma processing and the surface of the first substrate region is modified to a surface on which the intermediate film is not formed.

18. A system for forming a target film on a substrate, the system comprising:
    a transfer chamber having a transfer device for transferring the substrate;
    an intermediate film forming device connected to the transfer chamber;
    a target film forming device connected to the transfer chamber;
    a self-assembled monolayer adsorbing device connected to the transfer chamber;
    a plasma processing device connected to the transfer chamber; and a controller configured to control the transfer device, the intermediate film forming device, the target film forming device, the self-assembled monolayer adsorbing device and the plasma processing device, the controller being configured to control the transfer device, the intermediate film forming device, the target film forming device, the self-assembled monolayer adsorbing device and the plasma processing device to implement the method of claim 17.

* * * * *